(12) United States Patent
Sogard

(10) Patent No.: US 7,709,813 B2
(45) Date of Patent: May 4, 2010

(54) INCIDENCE SURFACES AND OPTICAL WINDOWS THAT ARE SOLVOPHOBIC TO IMMERSION LIQUIDS

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 63 days.

(21) Appl. No.: 11/692,674

(22) Filed: Mar. 28, 2007

(65) Prior Publication Data

US 2007/0229957 A1 Oct. 4, 2007

Related U.S. Application Data

(60) Provisional application No. 60/789,025, filed on Apr. 3, 2006.

(51) Int. Cl.
*G02B 1/10* (2006.01)
(52) U.S. Cl. .................................................. 250/492.1
(58) Field of Classification Search .................. 250/372
See application file for complete search history.

(56) References Cited

U.S. PATENT DOCUMENTS

| | | | |
|---|---|---|---|
| 7,075,616 B2* | 7/2006 | Derksen et al. | 355/30 |
| 2004/0211920 A1* | 10/2004 | Maria Derksen et al. | 250/492.1 |
| 2005/0123863 A1* | 6/2005 | Chang et al. | 430/322 |
| 2005/0134815 A1* | 6/2005 | Van Santen et al. | 355/30 |
| 2005/0147920 A1* | 7/2005 | Lin et al. | 430/311 |
| 2005/0161644 A1* | 7/2005 | Zhang et al. | 252/582 |
| 2005/0175776 A1 | 8/2005 | Streefkerk et al. | |
| 2005/0175940 A1* | 8/2005 | Dierichs | 430/322 |
| 2005/0181195 A1* | 8/2005 | Dubrow | 428/297.4 |
| 2005/0202351 A1* | 9/2005 | Houlihan et al. | 430/322 |
| 2005/0259234 A1* | 11/2005 | Hirukawa et al. | 355/53 |
| 2005/0264774 A1* | 12/2005 | Mizutani et al. | 355/30 |
| 2006/0017900 A1 | 1/2006 | Novak | |
| 2006/0023182 A1 | 2/2006 | Novak et al. | |
| 2006/0023183 A1 | 2/2006 | Novak et al. | |
| 2006/0023184 A1 | 2/2006 | Coon et al. | |
| 2006/0023185 A1 | 2/2006 | Hazelton et al. | |
| 2006/0023186 A1 | 2/2006 | Binnard | |
| 2006/0023187 A1 | 2/2006 | Eaton | |

(Continued)

FOREIGN PATENT DOCUMENTS

EP 1 699 072 A1 9/2006

OTHER PUBLICATIONS

"Technology backgrounder: Immersion Lithography," ICKnowledge, pp. 1-5, 2003.

(Continued)

*Primary Examiner*—David P Porta
*Assistant Examiner*—Djura Malevic
(74) *Attorney, Agent, or Firm*—Klarquist Sparkman, LLP

(57) ABSTRACT

Optical windows are provided that transmit light such as deep-UV (DUV) light. An exemplary window includes a window substrate that is transmissive to at least one wavelength of the light. The window substrate has an incidence surface decorated with sub-wavelength asperities arranged so as to render the incidence surface solvophobic to the light-transmissive liquid. The arrangement of sub-wavelength asperities can be configured to render the incidence surface super-solvophobic to the liquid. The sub-wavelength asperities can have any of various shapes and combinations thereof, and can be regularly or irregularly arranged.

19 Claims, 8 Drawing Sheets

U.S. PATENT DOCUMENTS

| | | | |
|---|---|---|---|
| 2006/0028632 A1 | 2/2006 | Hazelton et al. | |
| 2006/0029884 A1* | 2/2006 | Hatakeyama et al. | 430/270.1 |
| 2006/0033899 A1 | 2/2006 | Hazelton et al. | |
| 2006/0077367 A1 | 4/2006 | Kobayashi et al. | |
| 2006/0092533 A1 | 5/2006 | Sogard | |
| 2006/0103832 A1 | 5/2006 | Hazelton et al. | |
| 2006/0114435 A1 | 6/2006 | Hazelton et al. | |
| 2006/0138347 A1* | 6/2006 | Bruinsma et al. | 250/491.1 |
| 2006/0139614 A1 | 6/2006 | Owa et al. | |
| 2006/0152697 A1 | 7/2006 | Poon et al. | |
| 2006/0197036 A1* | 9/2006 | Severijns et al. | 250/492.1 |
| 2006/0286305 A1* | 12/2006 | Thies et al. | 427/508 |
| 2006/0289794 A1* | 12/2006 | Furukawa et al. | 250/492.1 |
| 2007/0004182 A1* | 1/2007 | Chang et al. | 438/478 |
| 2007/0114451 A1* | 5/2007 | Jansen et al. | 250/492.1 |

OTHER PUBLICATIONS

Bauman et al., "Learning From The Lotus Flower—Selfcleaning Coatings On Glass," *Glass Processing Days*, pp. 330-333, 2003.

Blossey, "Self-cleaning surface—virtual realities," *Nature Materials*, vol. 2, pp. 301-306, May 2003.

Contact Angles AN #102, accessed at http://www.ksvinc.com/contact_angle.htm, 7 pp., Apr. 14, 2006.

"Detailed information on the Lotus-Effect® (German)," accessed at http://www.nees.uni-bonn.de/lotus/en/prinzip_html.html, 5 pp., Apr. 27, 2006.

Dumé, "Turning the lotus effect on its head," *Physics Web*, 2 pp., Apr. 6, 2005.

French et al., "Second generation fluids for 193nm immersion lithography," *Proceedings of SPIE*, vol. 6154, pp. 615415-1 to 615415-7, 2006.

Hosono and Zhou, "To Super-Hydrophobic Surface From Hydrophilic Surface through Nanostructure Control," *Sansouken Today*, pp. 26-27, Jan. 2006. (and English translation).

Klein et al., "Producing Super-Hydrophobic Surfaces with Nano-Silica Spheres," translated from *Zeitschrift für Metallkunde*, vol. 94, 12 pp., 2002.

Nakajima et al., "Recent Studies on Super-Hydrophobic Films," *Chemical Monthly*, vol. 132, pp. 31-41, 2001.

Pomeau and Villermaux, "Two Hundred Years of Capillarity Research," *Physics Today*, pp. 39-44, Mar. 2006.

Quéré, "Fakir droplets," *Nature Materials*, vol. 1, pp. 14-15, Sep. 2002.

Quéré, "Non-sticking drops," *Reports on Progress in Physics*, vol. 68, pp. 2496-2532, 2005.

Wright, "Lotus Leaf Inspires Waterproofing Scheme," Scientific American. com, 2 pp., Mar. 3, 2003.

Zyga, "Scientists confirm role of nano-hairs in self-cleaning lotus leaf," *Nanotechnology*, 2 pp., Feb. 17, 2006.

International Search Report, Apr. 21, 2008, 3 pages.

Nakajima et al, "Recent Studies on Super-Hydrophobic Films," Monatshefte fur Chemie, vol. 132, (2001) pp. 31-41, 11 pages.

English Translation of Official Letter, dated Nov. 20, 2009, in corresponding Chinese application (5 pages).

\* cited by examiner

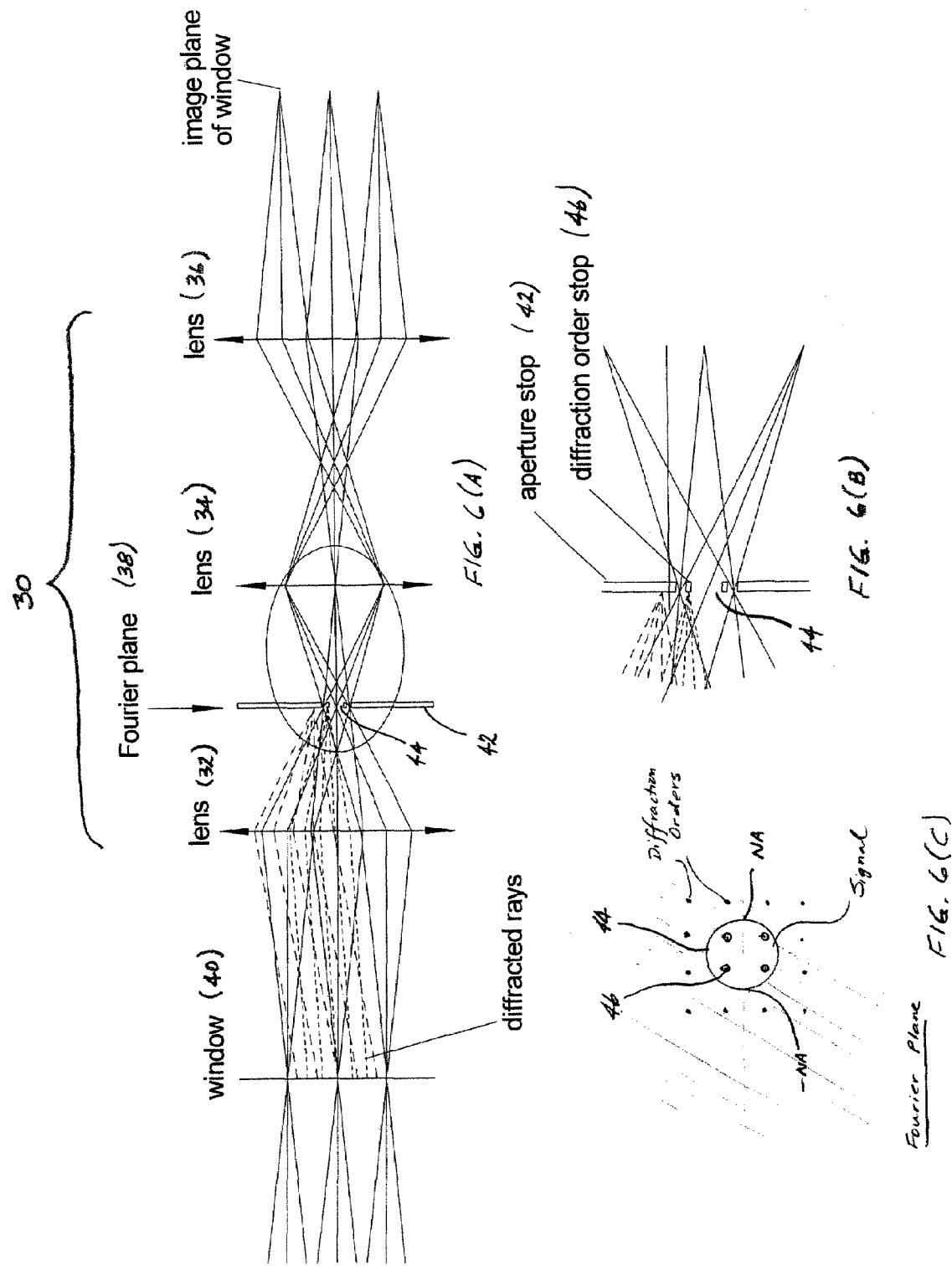

INCIDENCE SURFACES AND OPTICAL WINDOWS THAT ARE SOLVOPHOBIC TO IMMERSION LIQUIDS

CROSS-REFERENCE TO RELATED APPLICATION

This application corresponds to, and claims the benefit of, U.S. Provisional application No. 60/789,025, filed on Apr. 3, 2006, which is incorporated herein in its entirety.

FIELD

This disclosure pertains generally to, inter alia, optical windows and to optical sensors used in association with optical windows. The optical windows are useful on or associated with, for example, the substrate stage of an immersion-microlithography system utilizing deep-ultraviolet (DUV) light. Such windows serve to isolate and protect sensors, used for detecting and monitoring exposure alignment and image quality, for example, from contact with an immersion liquid that is transmissive to the exposure light. The subject optical windows and other incidence surfaces resist "wetting" by (i.e., are "solvophobic" to) the immersion liquid.

BACKGROUND

In immersion microlithography, as in other types of microlithography, an image of a desired pattern is transferred by a beam of exposure light to a suitable substrate. In many types of microlithography systems the pattern is defined by a reticle or mask. The reticle is illuminated by an illumination beam to form a patterned imaging beam. The imaging beam passes through a projection-optical system that shapes and conditions the beam as required to form the pattern image on a suitable substrate such as a semiconductor wafer, glass plate, or the like. For exposure, the substrate normally is held on a movable platform called a "substrate stage," and the reticle normally is held on a movable platform called a "reticle stage." The stages undergo controlled motion relative to each other as exposure of the substrate progresses. So as to be imprintable with the pattern image, the substrate usually is coated with a light-sensitive material called a "resist."

To perform accurate exposures, the microlithography system is equipped with detectors and sensors that ensure, for example, proper alignment of the reticle and substrate with each other and with the system optics. Respective detectors and sensors are placed at various locations throughout the microlithography system, including on or in proximity to the reticle stage and the substrate stage.

To obtain better imaging resolution microlithographic exposures are normally performed at shorter wavelengths of exposure light. The incessant demands of forming increasingly more and smaller active-circuit elements in micro-circuits has generated a relentless demand for microlithography systems that can make exposures using shorter wavelengths. The currently most advanced microlithography systems that are commercially available perform exposures using deep-ultraviolet light produced by excimer lasers. The wavelength range for this light is approximately 150-250 nm, which is generally in the "deep-ultraviolet" or "DUV" range, wherein a favorite current wavelength is 193 nm. Very few materials are transmissive to this and other DUV wavelengths. Since optical glass is not transmissive to DUV, the projection-optical system and other system optics are usually made of fused silica (amorphous quartz).

As the world awaits a practical "next-generation" lithography system capable of making exposures at wavelengths substantially less than the excimer-laser-produced DUV wavelengths, substantial effort is being directed to urging more imaging performance from systems employing excimer laser light. In this effort, surprisingly good results have been obtained from excimer-laser-based systems that utilize "immersion" projection optics. These "immersion-microlithography" systems exploit a principle used in light microscopy, in which improved image resolution is obtained by interposing a liquid (having a refractive index substantially greater than of air) between the specimen and the objective lens. In immersion-microlithography systems an immersion liquid is interposed between the end of the projection lens and the substrate surface on which the projection lens forms the image. Whereas light-microscopy apparatus can readily accommodate use of an immersion liquid (usually an oil) in this manner, accommodating an immersion liquid in a microlithography system is more problematic, especially without actually degrading imaging performance or causing other problems.

Currently, in most immersion microlithography systems, water is generally used as the immersion liquid. As an immersion liquid, water has many desirable properties. It has a refractive index (n) of approximately 1.44 (compared to n=1 for air), and it is transmissive to the wavelength of exposure light currently being used ($\lambda$=193 nm) in immersion microlithography. Water also exhibits high surface tension, low viscosity, good thermal conductivity, and no toxicity, and the optical properties of water are well known.

To supply immersion liquid in an immersion-microlithography system, the projection-optical system is provided with a nozzle assembly (some configurations are aptly called "showerheads") situated at or near the end of the projection-optical system adjacent the substrate. The nozzle assembly is configured to discharge the immersion liquid and to recover excess immersion liquid as required to maintain a desired amount of the liquid at the desired location in the space between the projection optics and the substrate surface.

Substrate stages used in immersion-microlithography stages typically have several optical sensors used for alignment and image evaluation. In each such sensor, a respective "optical window" normally separates the actual sensor element from the environment of the substrate stage, and detection light passes through the optical window to the sensor element. Many of these sensors are located so as to be situated at or close to the edge of the substrate carried on the stage. Thus, with a substrate stage of an immersion-microlithography system, there are instances in which the upstream-facing surface (incidence surface) of an optical window for a sensor may be contacted, at least intermittently during exposure of a substrate or exchange of substrates, by the immersion liquid.

Use of water as an immersion fluid has revealed that contact of the immersion liquid with the incidence surface can have any of several undesirable consequences. For example, such contact can cause formation of bubbles in the body of water contacting the incidence surface, especially whenever the body of water and the window are experiencing relative motion. Also, such contact can result in formation of droplets of immersion water that remain behind on the incidence surface after the body of immersion water has passed over the window. In either event, bubbles or droplets usually interfere with the function of the sensor located downstream of the window. Additionally, droplets can also perturb the fluid body remaining in the nozzle assembly if the stage motion subsequently brings the droplets and fluid body together again, thereby producing further disruption of the fluid body. These problems with bubble and droplet formation tend to be more pronounced at higher stage velocities, which is unfortunate because higher material throughput from the microlithography system usually requires higher stage velocities.

To reduce adverse consequences of contact with immersion water, the incidence surface of a conventional optical window for a sensor associated with the substrate stage is usually flush (coplanar) with the upper surface of the substrate resting on the substrate stage. Also, the incidence surface is coated with a film of a "hydrophobic" ("water-hating") substance. A substance that is hydrophobic resists being wetted by water. Hence, droplets of water placed on the film tend to assume a "beaded" configuration rather than spreading out onto the film surface. The presence of a hydrophobic surface reduces the likelihood that the fluid body will be perturbed by motion over the surface, thereby leading to droplet formation. More generally, a water droplet placed on a hydrophobic film exhibits a "contact angle" (θ) with the film surface of greater than 90°. Conventionally used hydrophobic-film materials are polytetrafluoroethylene (PTFE; a type of TEFLON®) and certain silane compounds such as fluoroalkylsilanes. These materials are normally applied to the incidence surfaces as very thin films to ensure that the films do not excessively block transmission of light through the window.

Although water currently is widely used as an immersion liquid in immersion microlithography, certain aspects of water are not entirely favorable. One aspect is its index of refraction. Desirably, the immersion fluid has an index of refraction that is equal to or greater than the index of refraction (approximately 1.6) of the objective element in the projection-optical system actually contacted by the fluid. Water has n=1.44, which has allowed its use as an immersion fluid for 193-nm immersion lithography at the 45-nm half-pitch node, but n=1.44 is inadequate for use in immersion lithography aimed at producing finer features (38-nm half-pitch node and below). Second, water tends to absorb into and partially dissolve resist applied to a substrate surface. As a water droplet on a resist surface evaporates, the bit of resist that had been dissolved in the droplet is left behind on the resist surface, usually at a different location than originally. This redeposited resist can significantly alter the topology of the resist surface and can cause problems with measurements (such as autofocus measurements) performed at the substrate surface. Third, water readily evaporates, which increases the concentration of water vapor in the vicinity of the substrate stage and of the various interferometers used for determining stage position. This change in vapor in the paths of the interferometer laser beams can introduce errors in measurements performed by the interferometers. Also, water vapor can damage delicate optical surfaces such as the reflective surfaces of mirrors used in the various interferometers.

Also, with conventional optical windows used in immersion microlithography systems in which water is used as the immersion fluid, the thin film of conventional hydrophobic substance applied to the incidence surface is easily damaged by high-intensity DUV exposure light and is not physically durable. Consequently, the thin film tends to have a short lifetime under actual-use conditions. Surfaces that are more durably "phobic" to the immersion liquid are needed.

In view of the limitations of water, new immersion liquids for immersion microlithography are currently being sought. The search is difficult because very few substances have the requisite high transparency to DUV light and a sufficiently high index of refraction to DUV light. High transparency is advantageous for several reasons, including maximizing the exposure light incident on the photoresist, minimizing photo-degradation of the fluid, and minimizing temperature increases of the fluid. Recent work has revealed promising results with certain saturated hydrocarbons, especially certain cyclic alkanes. For example, cyclohexane has an index of refraction of 1.55 at 193 nm, compared to approximately 1.44 for water. French et al., "Second Generation Fluids for 193 nm Immersion Lithography," *Proceedings SPIE* 6154:15, 2006. But, the new immersion liquids pose certain tradeoffs with respect to water. For example, compared to water the new liquids tend to be more viscous, have lower surface tension, and be more difficult to contain between the objective element and the substrate. They also tend to "wet" many surfaces more readily than water, resulting in a higher likelihood of droplets and films being left behind after passage of the liquid over a surface (such as of an optical window, which can interfere with sensor performance). Thus, the liquids pose new challenges with respect to making the incidence surfaces of optical windows sufficiently "phobic" to the liquids.

SUMMARY

Optical windows and related optical elements as described herein address the difficulties, summarized above, with conventional optical windows. An embodiment of an optical window is used for transmitting a beam of light, such as DUV light, and comprises a window substrate that is transmissive to at least one wavelength of the light. The window substrate has an incidence surface that is decorated with sub-wavelength asperities arranged so as to render the incidence surface solvophobic to a liquid that is transmissive to the light. The arrangement of sub-wavelength asperities can be configured to render the incidence surface super-solvophobic to the light-transmissive liquid.

By way of example, the sub-wavelength asperities can be posts, peaks, pyramids, rods, nubbins, tubules, hairs, other geometric shapes, irregular shapes, and combinations thereof. The asperities can be arranged in a regular array or an irregular array, a random array, or in array in which the asperities are identical to each other.

The asperities can have respective top surfaces that are substantially not transmissive to the at least one wavelength. In such a configuration, the asperities can be separated from one another by hollows, wherein the hollows are transmissive to the at least one wavelength. In other embodiments each asperity has a top surface having a dimension no greater than $\lambda/10$, wherein $\lambda$ is a wavelength of the light.

The arrangement of sub-wavelength asperities can be configured to provide solvophobicity to the incidence surface according to a Wenzel model. Alternatively, the arrangement of sub-wavelength asperities can be configured to provide solvophobicity to the incidence surface according to a Cassie model. Further alternatively, the arrangement of sub-wavelength asperities can be configured according to a "fakir" state to provide solvophobicity to the incidence surface. The fakir state can be metastable.

Another aspect is directed to a solvophobic surface contacted by a liquid that is transmissive to at least one wavelength of light (such as, but not limited to, DUV light). In an embodiment the surface is transmissive to the at least one wavelength and is decorated with an arrangement of sub-wavelength asperities configured to render the incidence surface solvophobic to the light-transmissive liquid. The solvophobic surface can be of, for example, an optical window.

Another aspect is directed to an optical sensor. An embodiment comprises a light sensor and an optical window through which a beam of sensor light is transmitted to the light sensor. The optical window comprises a window substrate that is transmissive to at least one wavelength of the sensor light.

The window substrate has an incidence surface that is decorated with sub-wavelength asperities arranged so as to render the incidence surface solvophobic to a sensor-light-transmissive liquid.

The optical sensor can further comprise an optical system situated between the optical window and the light sensor. The optical system can comprise a first lens having a Fourier plane, and an aperture stop situated at the Fourier plane. The aperture stop defines an aperture that is sized to transmit a lower order of diffracted light from the optical window while blocking a higher order of diffracted light from the optical window. The optical sensor further can comprise at least a second lens situated between the Fourier plane and the light sensor, in which embodiment the aperture stop further can include at least one diffraction-order stop within the aperture.

Yet another aspect is directed to immersion microlithography systems utilizing an exposure light (e.g., DUV light) for exposing a pattern onto a substrate. An embodiment of such a system comprises a substrate stage, a projection-optical system, and an optical sensor. The substrate stage is configured to hold the substrate as the pattern is being exposed by the exposure light onto the substrate. The projection-optical system directs the exposure light onto the substrate, wherein the DUV light from the projection-optical system passes through an exposure-light-transmissive immersion liquid situated between the projection-optical system and the substrate. The optical sensor is associated with the substrate stage, and comprises (a) a light sensor; and (b) an optical window through which a beam of sensor light is transmitted to the light sensor. The optical window comprises a window substrate that is transmissive to at least one wavelength of the sensor light. The window substrate has an incidence surface that is decorated with sub-wavelength asperities arranged so as to render the incidence surface solvophobic to the immersion liquid.

The foregoing and additional features and advantages of apparatus as described herein will be more readily apparent from the following detailed description, which proceeds with reference to the accompanying drawings.

BRIEF DESCRIPTION OF THE DRAWINGS

FIG. 6(A) is a schematic diagram of a representative embodiment of an optical system that can be placed between the optical window and a sensor, for example, to remove at least some scattered light and at least some diffracted light produced by the optical window.

FIG. 6(B) shows detail in the vicinity of the aperture stop in the optical system of FIG. 6(A).

FIG. 6(C) is an orthogonal view of the region shown in FIG. 6(B).

DETAILED DESCRIPTION

Figure 1:
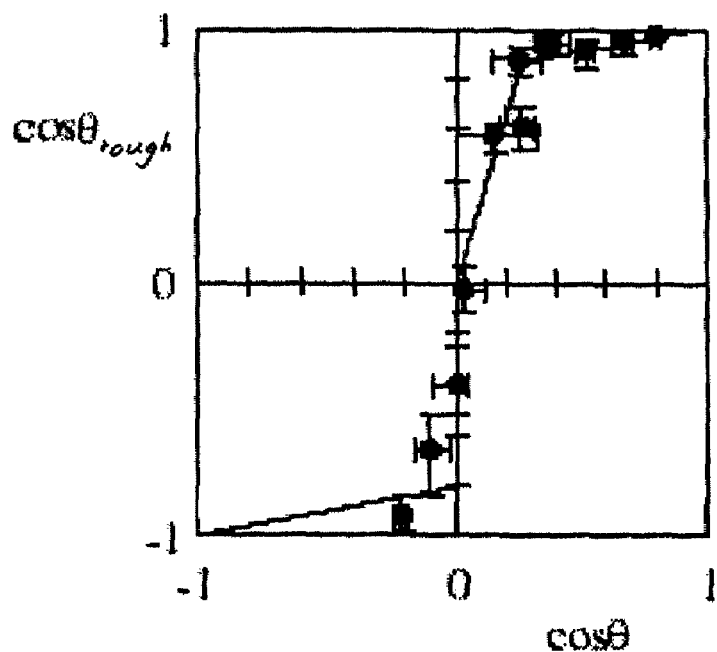
FIG. 1 is a plot of the cosine of $\theta_{rough}$, the apparent contact angle on a rough surface, as a function of the cosine of the Young contact angle ($\theta$) as determined on a flat surface of the same material, and varied using different liquids.

The subject optical surfaces and optical windows, and related methods, are discussed below in the context of representative embodiments that are not intended to be limiting in any way.

An "optical window" is generally an optical element that, when situated in a light-propagation path, transmits a usable amount of the incident light, such as to a structure located downstream of the window. Thus, the optical window can serve to separate the downstream environment from the environment upstream of the window, while still allowing light to pass through the window from upstream to downstream. An optical window can be refractive or non-refractive (an example of the former is a lens and an example of the latter is a "flat.") An optical window for use in an immersion-microlithography system that utilizes DUV exposure light typically exhibits a usable transmissivity to incident DUV light. Optical windows in immersion-microlithography systems usually are situated and configured to allow passage of sensor light (usually of substantially the same wavelength of DUV light used for exposure) through the window to a downstream optical sensor. These optical windows are advantageous for protecting the sensors from the immersion liquid used for exposure in the upstream environment. An optical window, whether refractive or not, for DUV is typically made from a suitable DUV-transmissive optical substrate, such as fused silica (amorphous quartz). The optical window has an incidence surface that faces upstream toward the light source used for sensing and a reverse surface that faces downstream toward the respective sensor or other downstream structure. An optical window can be situated and configured to pass light to more than one downstream structure, such as multiple sensors.

While the various aspects described below are applicable to at least one surface (typically the incidence surface) of an optical window, the aspects also can be applied to any of various other surfaces, such as the surface of a stage, of which resistance to wetting is desirable or necessary.

A "hydrophilic" surface exhibits a contact angle, with droplets of water on the surface, of less than 90°, and (as noted above) a "hydrophobic" surface exhibits a contact angle, with droplets of water on the surface, of greater than 90°. Most smooth, clean, glass surfaces exhibit a contact angle of approximately 30° or less to water droplets; hence, these surfaces are hydrophilic. A smooth, glass surface coated with a surficial film of alkylsilane or TEFLON® exhibits a contact angle to water droplets of approximately 100° to 10° and hence is hydrophobic. Accordingly, and more generally, droplets of a particular liquid ("solvent") on a surface that is "solvophobic" to the solvent exhibit a contact angle of greater than 90°, and droplets of the solvent on a surface that is "solvophilic" to that solvent exhibit a contact angle of less than 90°. "Super-solvophobicity" is characterized by contact angles of approximately 1500 to 180°.

For maximal benefit in an immersion-microlithography system, an immersion liquid should not only be highly transmissive to the exposure wavelength but also have a refractive index that is equal to or greater than the refractive index of the last optical element in the projection-optical system (i.e., the optical element that is closest to the substrate surface). The refractive index of water (n=1.44) does not quite meet this criterion; an immersion liquid having a refractive index of approximately 1.6 or higher would be better in this regard. Consequently, efforts are currently underway to find better immersion liquids than water for use in immersion-microlithography systems operating with an exposure wavelength of 193 nm or other wavelength in the DUV range.

The candidate immersion liquids studied to date, while exhibiting transmissivity to the intended wavelength of DUV light, tend to have respective surface tensions that are lower than of water, have respective viscosities that are higher than of water, and exhibit respective contact angles on conventional hydrophobic-film surfaces that are lower than exhibited by water. Consequently, it is typically more difficult to confine these liquids under the objective lens, which increases the probability of droplets and/or a film of the immersion liquids being left on the sensor window after moving the window away from the objective lens. These immersion liquids also pose new challenges of rendering the sensor windows sufficiently solvophobic to the liquids without adversely affecting window (and hence sensor) performance. For example, the windows and their solvophobic incidence surfaces must not only be transmissive to the light that must pass through the windows to the respective sensors but also be optically compatible with their underlying sensors. In addition, the stage surface itself desirably also is solvophobic, although not for optical reasons.

The basic principle that determines the equilibrium shape of a liquid droplet on a surface was derived by Young in the 19th century. The droplet's shape is governed by the action of respective forces at the three-phase contact line of the droplet in the plane of the solid surface. This contact line is where the solid-liquid, liquid-vapor, and solid-gas interfaces meet. The respective forces (per unit length) acting at the contact line are the respective surface tensions, and the balance of these forces yields the famous Young's equation:

$$\cos\theta = \frac{(\gamma_{sv} - \gamma_{sl})}{\gamma_{lv}} \quad (1)$$

in which $\theta$ is the contact angle. Young, *Phil. Trans. R. Soc. London* 95:65-87, 1805. The respective surface tensions (also called "surface energies") for solid-vapor ($\gamma_{sv}$), solid-liquid ($\gamma_{sl}$), and liquid-vapor ($\gamma_{lv}$) each are in units of interfacial energy per unit area. A droplet of liquid fulfilling Young's equation is regarded as partially wetting the surface of the solid. If the sum ($\gamma_{sl}+\gamma_{lv}$)=$\gamma_{sv}$, then $\theta$ becomes zero, and the droplet will flatten out in a manner that is characteristic of it being on a "high-energy" surface that is easily wetted by the liquid. But, if the solid-vapor interface has a low surface energy, then the contact angle will increase, theoretically to as high as 180°, and the surface will resist being wetted by the liquid.

"Roughening" a surface increases the effective unit area of the surface, which changes Equation (1). Wenzel, *Ind. Eng. Chem.* 28:988, 1936; Wenzel, *J. Phys. Colloid Chem.* 53:1466, 1949. Roughening an incidence surface generally encompasses decorating the surface with any of various "roughness features" (also called "asperities") as described herein. Roughening increases the unit area of the incidence surface by a "roughness factor" r that increases both $\gamma_{sv}$ and $\gamma_{sl}$. The roughness factor r is the ratio of actual area to geometric projected area (apparent surface area), and in the Wenzel model r is always greater than unity. Roughening also alters the contact angle from $\theta$ to $\theta_{rough}$, the latter being the "rough-surface" contact angle:

$$\cos\theta_{rough} = r\cos\theta \quad (2)$$

The rough-surface contact angle $\theta_{rough}$ is understood to be a macroscopic value, usually averaged over the surface roughness. Equation (2) shows that a slightly hydrophobic surface ($\cos\theta<0$) can be made more hydrophobic by increasing the roughness of the surface; similarly, a hydrophilic surface ($\cos\theta>0$) can be made more hydrophilic by increasing the roughness of the surface. FIG. 1 depicts this effect for a very rough (fractal) surface. Specifically, FIG. 1 depicts the cosine of the apparent contact angle $\theta_{rough}$ on a rough surface as a function of the cosine of the Young contact angle $\theta$ (determined on a flat, or "non-rough," surface of the same material and varied using different liquids).

Figure 2:
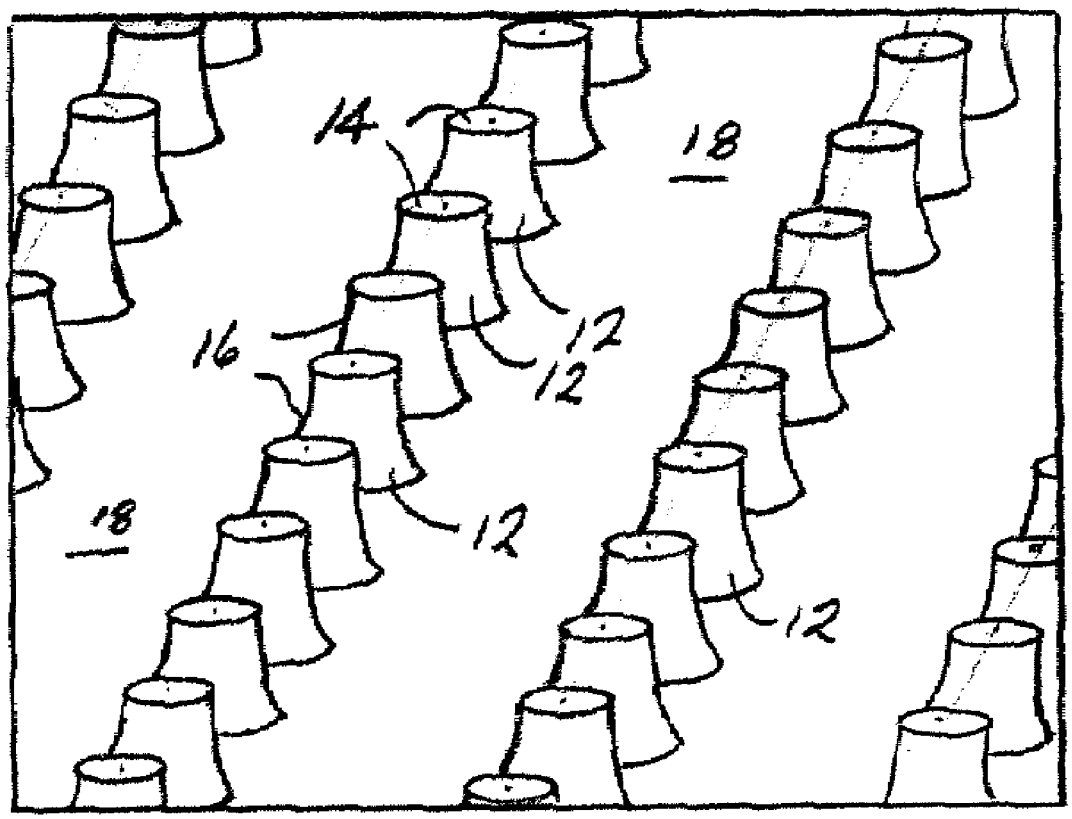
FIG. 2 is a perspective view of a portion of a surface decorated with posts as representative asperities (also called roughness features).
Figure 3:
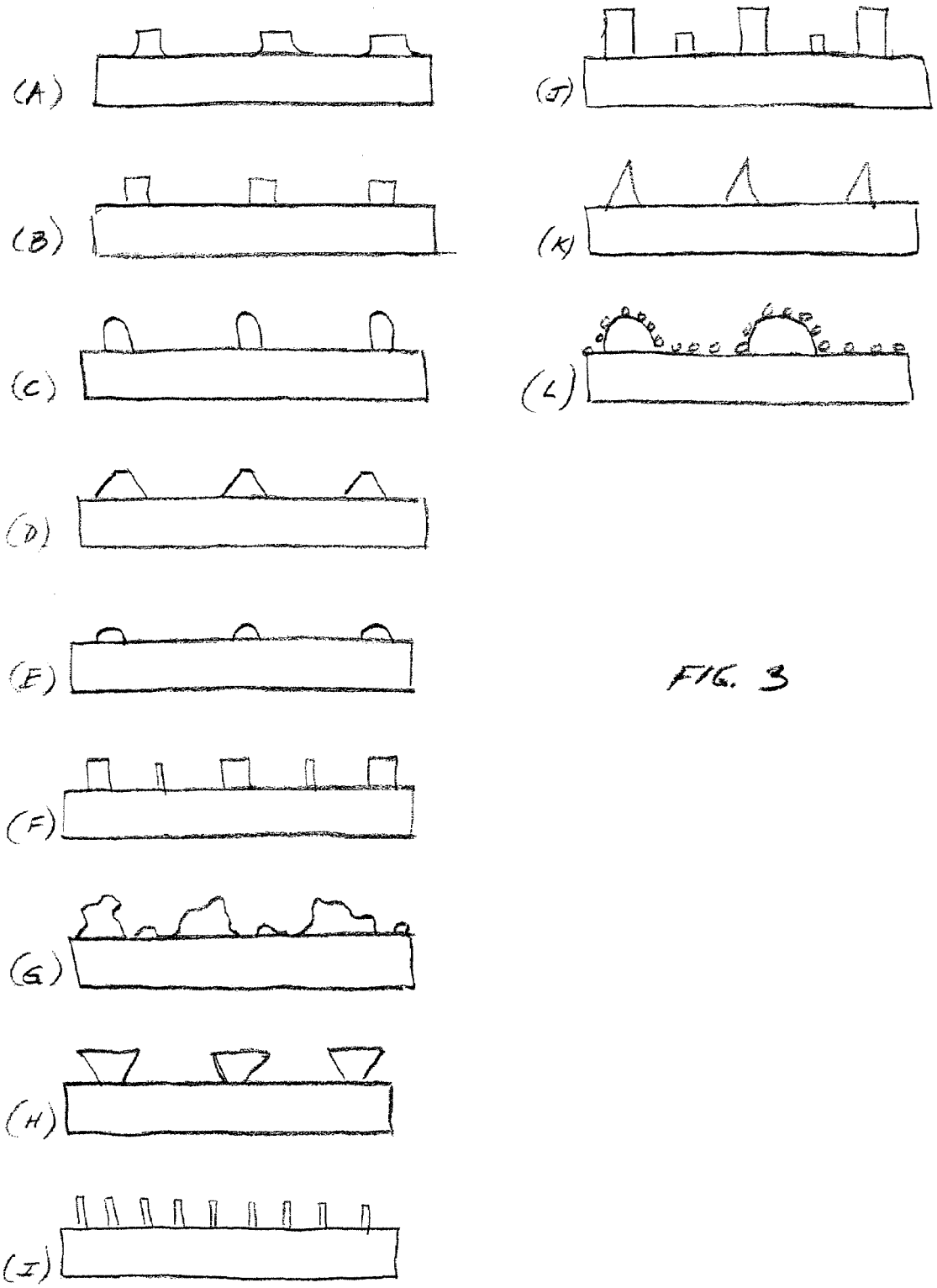
FIGS. 3(A)-3(L) are respective schematic elevational views of portions of optical windows each having an incidence surface decorated with a respective configuration of asperities, collectively exemplifying the range of asperity configurations that can be formed on the incidence surface.
Figure 4:
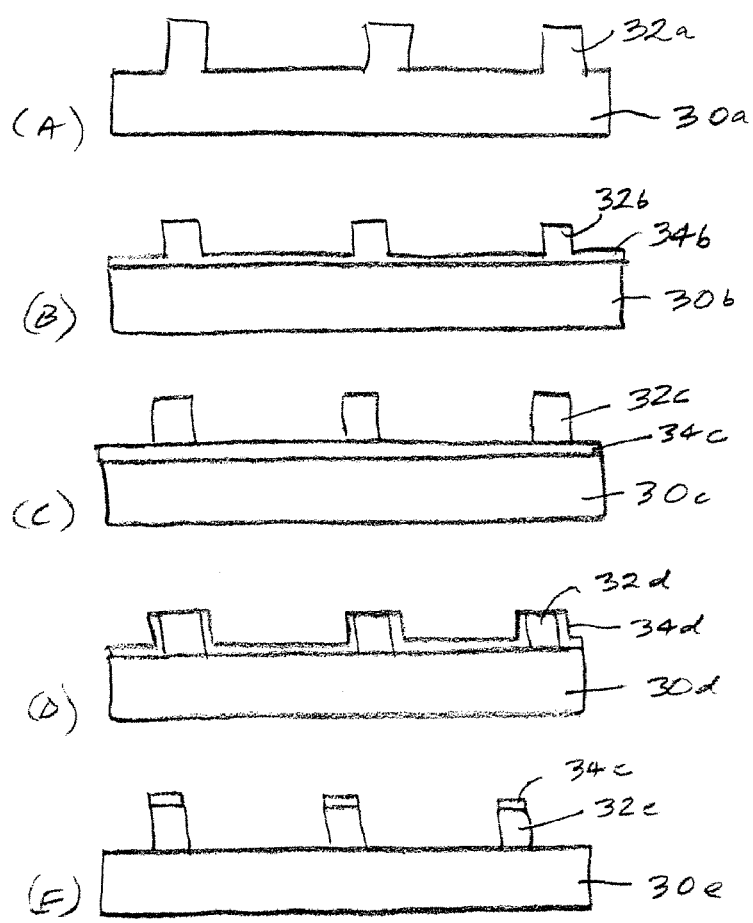
FIGS. 4(A)-4(E) are respective schematic elevational views of portions of optical windows each having a different respective layer configuration associated with exemplary asperities.

An exemplary manner of roughening a surface (such as an incidence surface) according to Wenzel involves decorating the surface with an arrangement (such as a regular array) of asperities such as posts, peaks, rods, or the like. An example configuration of this type is shown in FIG. 2, in which the asperities are respective posts 12 or peaks formed in an ordered array. Note that, in this exemplary configuration, the posts 12 have truncated "top" surfaces 14, steep sides 16, and "hollows" (valleys) 18 between them. The respective surfaces of the tops 14, sides 16, and hollows 18 have substantially the same solvophobicity. In the Wenzel model an immersion liquid on such a surface contacts all the surfaces, including the tops 14, the sides 16, and the hollows 18, which yields an increase in the phobicity or philicity of the surface. In various possible configurations, the asperities of a Wenzel surface can be identical or can vary one from the other. However, the arrangement (even a non-ordered or a random arrangement) typically is uniform over the entire surface, which allows r to be substantially constant everywhere on the surface.

The effect of roughness configured as shown for example in FIG. 2 can be approximated by representing the surface as an array of micron- or submicron-sized asperities configured as posts, but such a configuration is not intended to be limiting in any way. The asperities, together with the hollows between them, provide two different contact angles. This is the so-called "Cassie" model, discussed generally in Cassie and Baxter, *Trans. Faraday Soc.* 40:546-551, 1944; Cassie, *Discuss. Faraday Soc.* 3:11-15, 1948. According to the Cassie model, if a first region (contact angle $\theta_1$) covers a fraction $f_1$ of the surface (e.g., the total area of the tops of the asperities), and a second region (contact angle $\theta_2$) covers a fraction $f_2$ of the surface (e.g., total area of sides and hollows), then the macroscopic contact angle ($\theta$) is given to a good approximation by:

$$\cos\theta = f_1\cos\theta_1 + f_2\cos\theta_2 \quad (3)$$

In the Cassie model the immersion liquid generally contacts the tops of the asperities but not the sides thereof or the hollows between the asperities. As a result, in the hollows the liquid is separated from the underlying surface by a layer of air. If the second region $f_2$ is represented by the air-spaced hollows between the asperities of the roughness profile, then $\cos \theta_2 = -1$, and Equation (3) becomes $(f_1+f_2)=1$, yielding the following:

$$\cos \theta = f_1(1+\cos \theta_1)-1 \quad (4)$$

If $f_1$ is small, then much of the liquid is actually in contact with air, resulting in the surface exhibiting highly solvophobic (perhaps even super-solvophobic) behavior in which the liquid rests on the top of asperities in the manner of a "fakir" lying on a bed of nails. This condition is referred to as a "fakir state," Quéré, *Nature Mater.* 1:14-15, 2002.

The asperities used for rendering an incidence surface solvophobic can have any of various configurations, including (but not limited to) posts, rods, pyramids, peaks, nubbins, hemispheres, tubules, hairs, and other regular and irregular shapes, simple or compound, as shown in FIGS. 3(A)-3(L). The asperities can be arranged in a regular array as shown in FIG. 2 or in an irregular or random arrangement. The asperities may be self-affine. The asperities need not all have the same size and/or shape. The asperities may be joined together by ridge-like structures.

Referring again to the specific example shown in FIG. 2 the depicted relative size of individual posts is not necessarily limiting. As discussed later below, it is desirable that the dimensions (other than height) of asperities on a roughened incidence surface be "sub-wavelength," or less than the wavelength of DUV light incident on the surface. The asperities can all have the same configuration (as in FIG. 2) or can have different configurations across the incidence surface. Whether the same or different, the asperities can be arranged randomly or in an ordered manner. The asperities can be made, for example, of the same material as the window substrate or of a material applied to or formed on the surface of the window substrate. The asperities (and intervening hollows, if desired) can be coated, such as with a thin layer of fluorinated silane or other solvophobic material. Alternatively, the asperities themselves can be formed from a solvophobic material such as TEFLON® or CYTOP®, a fluoropolymer.

A roughened incidence surface can provide solvophobicity or increased solvophobicity to the surface, even if a corresponding smooth incidence surface is not solvophobic. For example, solvophobicity has been achieved, with a honeycomb pattern of a fluorocarbon material, for benzene which has a surface tension of 28.9 mN/m (which is comparable to some of the new immersion liquids currently being developed). For comparison purposes, the surface tension of water is 73 mN/m.

A super-solvophobic surface created by roughening the surface of a solvophilic material can revert to solvophilicity under certain circumstances or conditions. For example, reversion can occur if solvent condenses from a vapor onto the surface (including in the hollows), or if an externally applied pressure forces the solvent into intimate contact with the surface (e.g., in the hollows and on the sides of asperities). Most candidate new immersion liquids for immersion microlithography have lower vapor pressures than water, so the probabilities of condensation of these liquids on an incidence surface are less than with water. Also, intermittent contact of the incidence surface with any of the liquids may reduce the likelihood of reversion to solvophilicity.

The periodic array and configuration of asperities shown in FIG. 2 is only one example of a solvophobicity-enhanced incidence surface that can favor the fakir state. Thus, it will be understood that the FIG. 2 configuration is not limiting. Exemplary modifications include, but are not limited to: placing the asperities more closely or less closely spaced from one another; configuring the asperities to have a different aspect ratio than depicted; configuring the asperities to be "sharper" or blunter than shown; configuring the asperities with tops that are other than flat, such as rounded tops; coating or not coating the asperities; configuring the asperities all alike, all different, or a combination of at least two shapes and/or sizes; providing the asperities with more steeply or less steeply inclined sides; making the sides angular as shown or rounded; and/or providing asperities with additional micro- or nanostructure. These various configurations are shown in FIGS. 3(A)-3(L). Note also that an "arrangement" of roughness features can be ordered (arrayed), irregular, or random, or a combination of these.

The circumstances under which a liquid can be expected to be in contact with all portions (asperities, asperity-tips, and hollows; termed a "Wenzel state") of a rough incidence surface are not fully understood. Also not fully understood are all the circumstances under which a liquid can be expected to exhibit aspects of the Cassie model in which the liquid contacts only the tops of the asperities (and thus exhibits a "fakir state" type of solvophobicity). Energetically, liquid-solid systems tend to reside in the lowest-energy state, which is the state exhibiting the smallest contact angle. In the case of water and aqueous liquids used as immersion liquids, for incidence surfaces that are only mildly solvophobic (when smooth), the Wenzel state appears to be favored. The fakir state, in which droplets contact the substrate substantially only at the tops of the asperities as a result of air-entrapment below, appears to be favored for contact angles (on a smooth surface) exceeding a critical value $\theta_c$ obtained by equating Equations (2) and (4):

$$\cos\theta_c = -\frac{1-f_1}{r-f_1} \quad (5)$$

Figure 5:
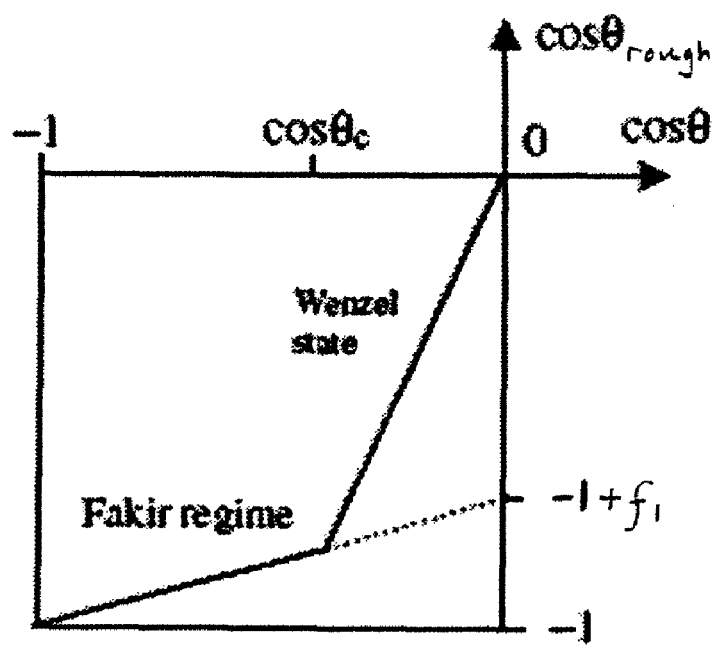
FIG. 5 is a plot showing two models of super-solvophobicity. For a moderate solvophobicity ($90°<\theta<\theta_c$), where $\theta_c$ is fixed by the roughness profile according to Equation (5), the apparent contact angle $\theta_{rough}$ is expected to be given by the Wenzel model expressed in Equation (2). In the other case ($\theta>\theta_c$), air remains trapped below the droplet, which rests on a composite surface made of solid and air ("fakir" state in which $\cos\theta_{rough}=-1+f_1(\cos\theta+1)$). A fakir state can exist when $\theta<\theta_c$ in spite of a higher energy. This metastable situation is represented by the dotted line.

Since $\cos \theta_c$ is always negative, $\theta_c$ is always greater than 90°. In practice, fakir states can sometimes exist even when the smooth-surface contact angle is less than $\theta_c$. These states generally are regarded as "metastable" fakir states that can revert to a Wenzel state upon application to the fluid of agitation or pressure. In many instances substantial perturbation is required to cause a reversion. Resistance to reversion can be a useful property of optical windows as disclosed herein. Notably, asperity configurations favoring reversion-resistant metastable fakir states can be created on solvophilic incidence surfaces. This finding is important because it allows highly solvophobic optical windows to be made, for certain immersion liquids of which no intrinsic solvophobic materials are available, that satisfy all requirements for use of the windows as detector windows. This situation is summarized in FIG. 5, in which the metastable situation is represented by the dotted line.

From the above, the solvophobicity of an incidence surface of an optical window or other structure is generally increased by "roughening," i.e., by decorating the incidence surface with an arrangement of roughness features or asperities. Roughening an initially solvophobic incidence surface can increase the solvophobicity of the surface, as can roughening an initially solvophilic incidence surface. Also, notably, roughening a mildly solvophilic incidence surface can confer a highly solvophobic property, perhaps a super-solvophobic property, to the surface, particularly if the asperities formed by roughening are appropriately selected and sized for the particular immersion fluid and wavelength of light (the sizes extending well below submicron dimensions).

Asperities can be arranged in a pattern (according to a regular array) or randomly on the incidence surface. Patterned and random asperities can be formed in the window substrate itself, or in a layer of material applied to the incidence surface of the window substrate. The asperities can be coated or uncoated. Candidate techniques for imparting roughness include: (a) forming on the incidence surface at least one layer, such as by spraying, dispersing, or simply depositing, followed by drying if required, of a suitably UV-transmissive particulate material such as fused silica or PTFE, either with or without a binder as required, wherein the particles form the asperities on the surface; (b) etching the incidence surface, such as chemically, electrically, or with a plasma, to form the arrangement of asperities; (c) plating or plasma-depositing at least one layer onto the incidence surface of a suitably UV-transmissive material that forms or is processed to form the desired arrangement of asperities; (d) solution-precipitation of at least one layer onto the incidence surface of a suitably UV-transmissive material that forms or is processed to form the desired arrangement of asperities; (e) chemical-vapor deposition onto the incidence surface of a suitably UV-transmissive material that forms or is processed to form the desired arrangement of asperities; (f) epitaxial growth on the incidence surface of a suitably UV-transmissive material that forms or is processed to form the desired arrangement of asperities; (g) molding a suitably UV-transmissive material on or onto the incidence surface, in a manner that forms the asperities or that involves subsequent processing to form the asperities; (h) microlithographic patterning of the incidence surface to form the asperities; and (i) forming at least one textured layer on the incidence surface of UV-transmissive particles of a low-surface energy material such as, but not limited to, fluoroalkylsilanes, fluoropolymers, waxes, fluorides, and/or fluorocarbons, wherein the particles form the arrangement of asperities.

Figure 4A:
Figure 4B:
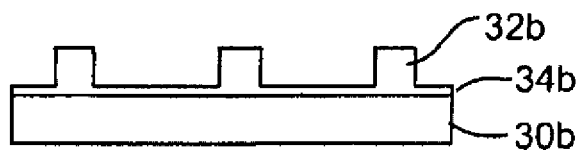
Figure 4C:
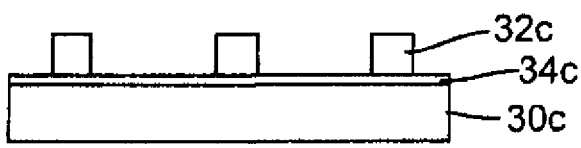
Figure 4D:
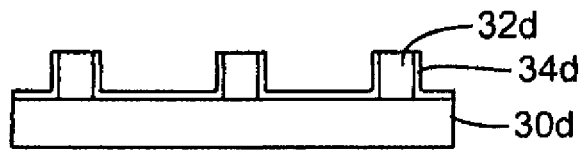
Figure 4E:
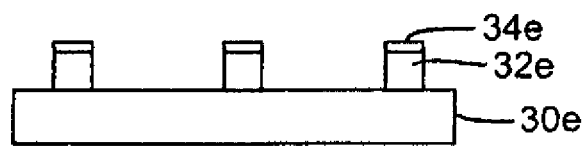
Figure 7:
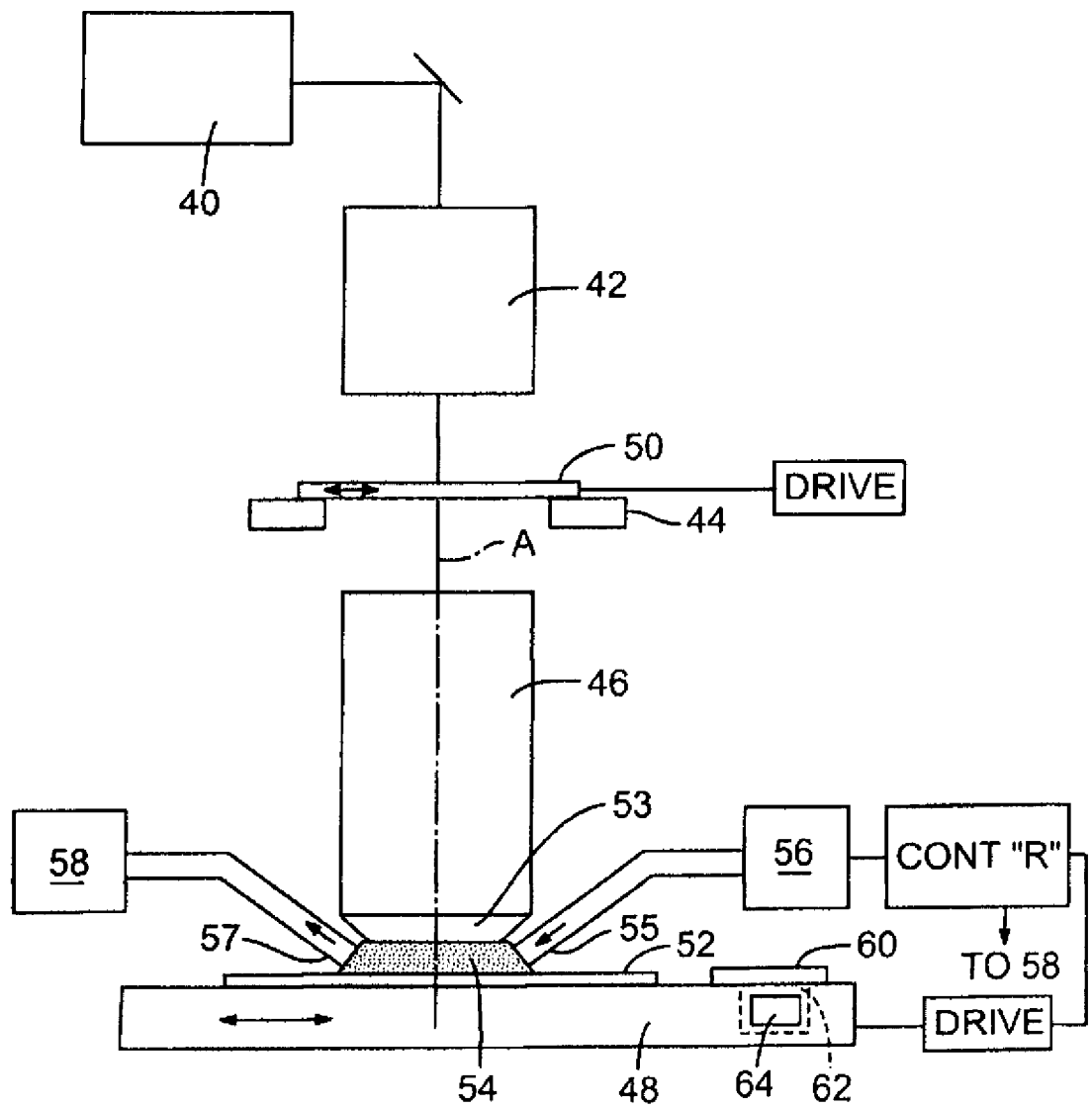
Figure 8:
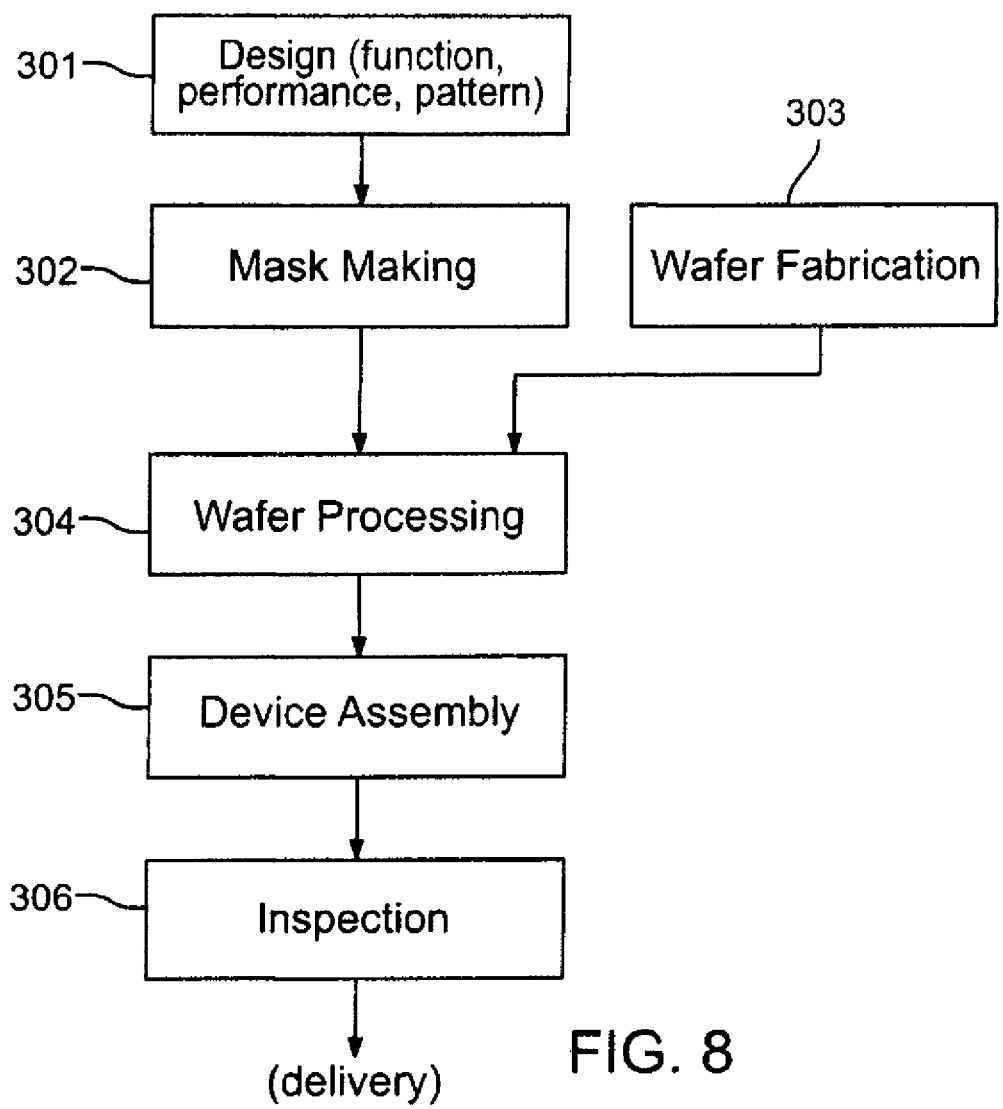
Figure 9:
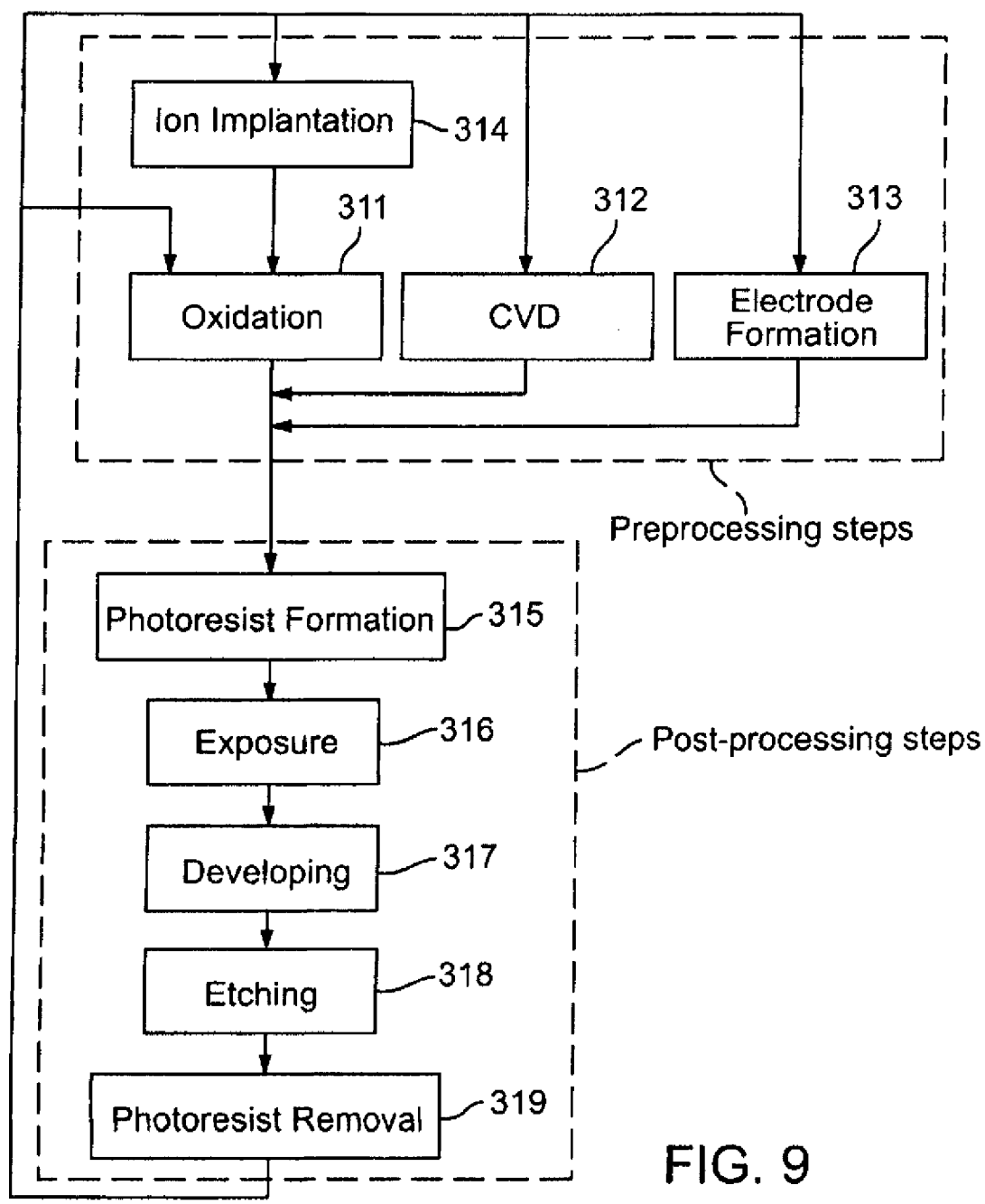

Reference is made to FIGS. 4(A)-4(E), which depict various exemplary ways in which a solvophobicity-altering layer can be applied to a surface. FIG. 4(A) depicts a surface 30a decorated with asperities 32a formed from the same material as the substrate. FIG. 4(B) depicts a surface 30b having a surficial layer 34b that forms the asperities 32b. FIG. 4(C) depicts a surface 30c having a surficial layer 34c on which the asperities 32c are formed. FIG. 4(D) depicts a surface 30d on which asperities 32d are formed either of the material of the surface 30d or with another substance, and a layer 34d is formed on the sides of the asperities and in the "valleys" between the asperities. FIG. 4(E) depicts a surface 30e on which asperities 32e are formed either of the material of the surface 30e or with another substance, and a layer 34e is formed on the tops of the asperities. These illustrations are exemplary; other configurations are possible.

Decorating an incidence surface with a random arrangement of asperities also can be achieved by application of a sol-gel (e.g., in the manner of a "moth-eye" filter used in high-power laser systems for preventing local concentration of laser-beam intensity in lenses) to the incidence surface. Sol-gel methods can be attractive because they usually can be performed at low cost and in a manner that does not compromise the optical character of the window substrate. The arrangement of asperities can be uniformly sized or hierarchical in nature, with multiple sizes of asperities. The arrangement can be fractal, self-affine, or non-fractal.

An advantage to decorating an incidence surface with asperities by any of the techniques mentioned above is that the asperities can be formed with sufficient depth ("thickness") on the incidence surface to provide good durability of the solvophobic property. Also, forming the asperities in the window substrate itself is advantageous because the window substrate usually is relatively unaffected by high-intensity incident light.

Sol-gel and other asperity-forming coatings for the incidence surface are advantageous because they also can be applied thickly, thereby providing asperities having substantially more thickness (height) than the thickness of the hydrophobic coatings currently used on optical windows for immersion microlithography. For example, a sol-gel coating can be tens of nanometers thick and can include particles that are several tens of nanometers in diameter. A general thickness range is tens of nanometers to micrometers. Increased thickness generally yields an optical window with more robust and durable performance.

If desired, the roughened surface can be treated using a solvophobic film-forming material such as a TEFLON®-containing material, fluorosilane, or organosilane material exhibiting an acceptable transmissivity to the wavelength of light passing through the window.

Roughening an incidence surface can result in the surface producing scattering and diffraction effects that could interfere excessively with the desired optical function of the surface. These phenomena can be of particular concern if the incidence surface is of an optical window. Scattering and/or diffraction can be reduced to insignificant levels by making the geometric scale of the asperities sufficiently fine relative to the wavelength of light. Generally, the asperities are smaller than the wavelength of light incident to the surface (asperities meeting this criterion are called "sub-wavelength" asperities). The smaller the asperities relative to the wavelength, generally the less scattering and diffraction from or through the surface. For example, making the asperities (e.g., a dimension of the area atop each asperity) approximately $\frac{1}{10}$ the wavelength, or even smaller, is practical and advantageous for reducing scattering and diffraction to tolerable levels. More specifically, for this DUV light, the asperities desirably are approximately 20 nm or smaller. Thus, an incidence surface can be made to exhibit a desired level of solvophobicity without significant loss of optical quality.

Scattering also can be reduced significantly by spacing individual asperities (e.g., posts or the like) at suitable distances from each other. For example, in FIG. 2 the posts 12 occupy only approximately 5% of the surface area of the window. Note that the asperities in such a configuration, and in other configurations providing large spacing between individual asperities, need not be transparent to the incident DUV radiation. Consequently, material choices for making the asperities are broader than in situations in which a DUV-transparent material is used.

Roughness can produce not only scattering but also significant amounts of diffracted light that can adversely affect the optical signal passing through the optical window. Diffraction can be reduced or avoided by interposing an optical system between the window and the sensor. An example embodiment of such a scheme is shown in FIGS. 6(A)-6(C). The optical system 30 in this embodiment comprises a first lens 32, a second lens 34, and a third lens 36. The Fourier plane 38 is the back focal plane of the first lens 32. Parallel rays from the window 40 are focused to a point in the Fourier plane 38.

Diffracted light from a simple transmission grating emerges from the grating at angles $\phi$ satisfying the grating equation:

$$d \sin \phi = n\lambda \qquad (6)$$

where d is the grating pitch and λ is the wavelength of incident light. The integer n is the diffraction order. From a simple linear grating, the diffracted light passing through a lens would be focused to a series of lines in the back focal plane, or Fourier plane, of the lens. From a two-dimensional structure such as shown in FIG. 2, various orders of diffracted light are focused to respective points in the Fourier plane (see FIG. 6(C)). An aperture stop 42 placed at the Fourier plane 38 can be used to eliminate transmission of higher diffraction orders from the signal (as well as some of the scattered light). Lower diffraction orders may lie within the aperture opening 44, which is equal to the numerical aperture (NA) of the system. These orders can be blocked, if desired or necessary, by placing opaque regions 46 on a transparent plate (not detailed) placed in the Fourier plane 38. This configuration allows most of the true signal to pass unhindered through the Fourier plane 38 to the sensor. Although the optical system 30 is shown as 1:1, it alternatively can be magnifying or demagnifying.

Figure 7:
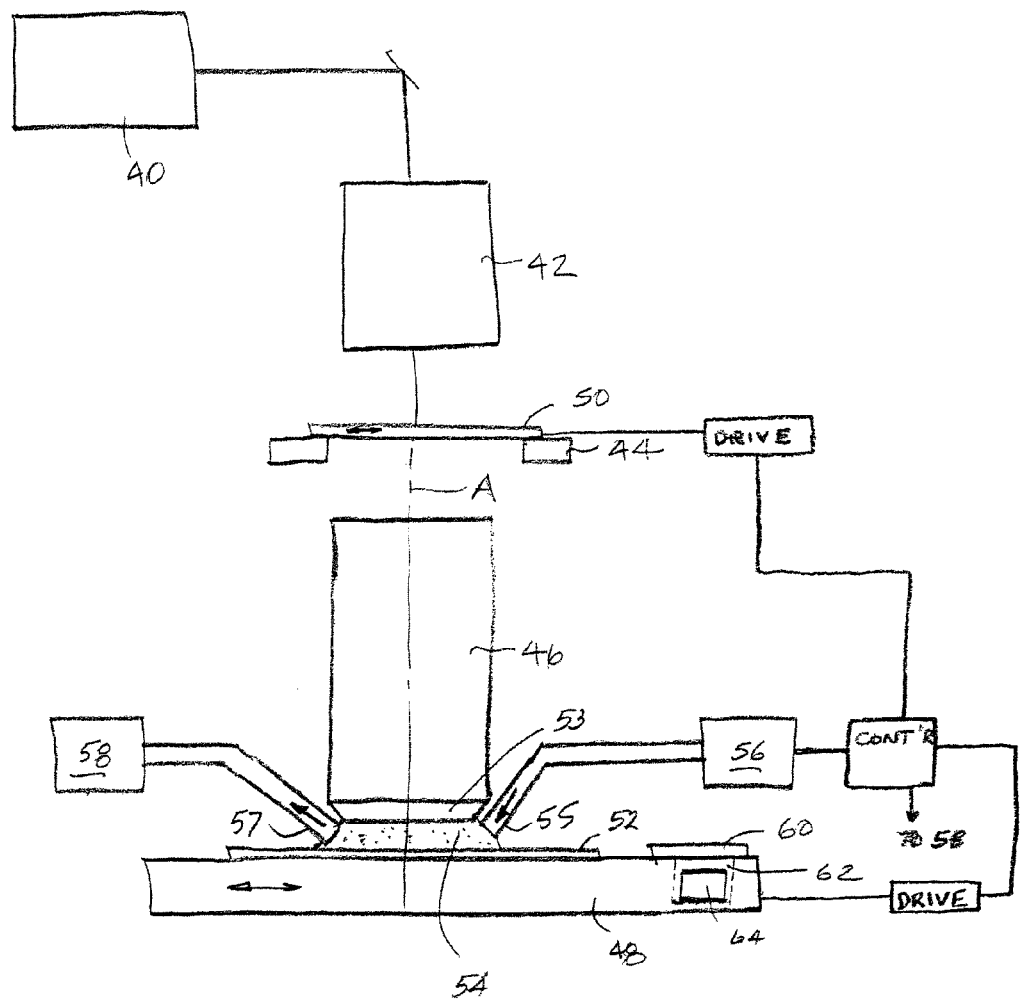
FIG. 7 is a schematic elevational view showing certain features of an immersion-lithography system including an optical window as described elsewhere herein.

Turning now to FIG. 7, certain features of an immersion lithography system are shown, namely, a light source 40, an illumination-optical system 42, a reticle stage 44, a projection-optical system 46, and a wafer (substrate) stage 48, all arranged along an optical axis A. The light source 40 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 42 includes an optical integrator and at least one lens that conditions and shapes the illumination beam for illumination of a specified region on a patterned reticle 50 mounted to the reticle stage 44. The pattern as defined on the reticle 50 corresponds to the pattern to be transferred lithographically to a wafer 52 that is held on the wafer stage 48. Lithographic transfer in this system is by projection of an aerial image of the pattern from the reticle 50 to the wafer 52 using the projection-optical system 46. The projection-optical system 46 typically comprises many individual optical elements (not detailed) that project the image at a specified demagnification ratio (e.g., 1/4 or 1/5) on the wafer 52. So as to be imprintable, the wafer surface is coated with a layer of a suitable exposure-sensitive material termed a "resist."

The reticle stage 44 is configured to move the reticle 50 in the X-direction, Y-direction, and rotationally about the Z-axis. The two-dimensional position and orientation of the reticle 50 on the reticle stage 44 are detected by a laser interferometer (not shown) in real time, and positioning of the reticle 50 is effected by a main control unit on the basis of the detection thus made.

The wafer 52 is held by a wafer holder ("chuck," not shown) on the wafer stage 48. The wafer stage 48 includes a mechanism (not shown) for controlling and adjusting, as required, the focusing position (along the Z-axis) and the tilting angle of the wafer 52. The wafer stage 48 also includes mechanisms for moving the wafer in the X-Y plane substantially parallel to the image-formation surface of the projection-optical system 46. The wafer stage 48 also includes mechanisms for adjusting the tilting angle of the wafer 52 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 46 normally comprises many lens elements that work cooperatively to form the exposure image on the resist-coated surface of the wafer 52. For convenience, the most distal optical element (i.e., closest to the wafer surface) is an objective lens 53. Since the depicted system is an immersion lithography system, it includes an immersion liquid 54 situated between the objective lens 53 and the surface of the wafer 52. As discussed above, the immersion liquid 54 is of a specified type. The immersion liquid is present at least while the pattern image of the reticle is being exposed onto the wafer.

The immersion liquid 54 is provided from a liquid-supply unit 56 that may comprise a tank, a pump, and a temperature regulator (not individually shown). The liquid 54 is gently discharged by a nozzle mechanism 55 into the gap between the objective lens 53 and the wafer surface. A liquid-recovery system 58 includes a recovery nozzle 57 that removes liquid from the gap as the supply 56 provides fresh liquid 54. As a result, a substantially constant volume of continuously replaced immersion liquid 54 is provided between the objective lens 53 and the wafer surface. The temperature of the liquid is regulated to be approximately the same as the temperature inside the chamber in which the lithography system itself is disposed.

Also shown is a sensor window 60 extending across a recess 62, defined in the wafer stage 48, in which a sensor 64 is located. Thus, the window 60 sequesters the sensor 64 in the recess 62. Movement of the wafer stage 48 so as to place the window 60 beneath the objective lens 53, with continuous replacement of the immersion fluid 54, allows a beam passing through the projection-optical system 46 to transmit through the immersion fluid and the window 60 to the sensor 64.

Figure 8:
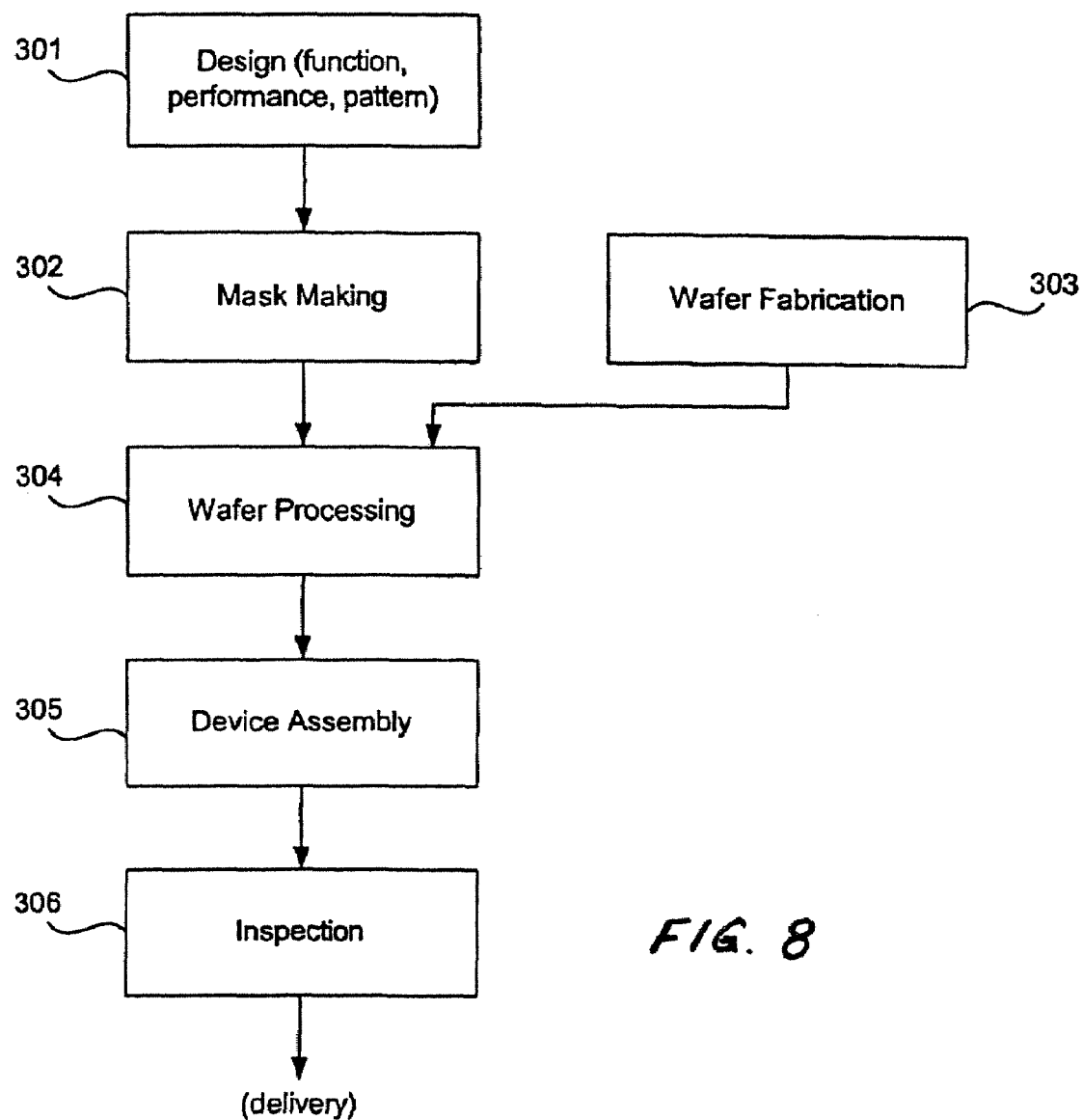
FIG. 8 is a process-flow diagram illustrating an exemplary process by which semiconductor devices are fabricated using the system shown in FIG. 7.

FIG. 8 depicts a process for fabricating a semiconductor device by using an immersion lithography system incorporating features as described above. In step 301 the device's function and performance characteristics are designed. Next, in step 302, a reticle having a pattern is designed according to the previous designing step. In a parallel step 303, a wafer is made from silicon or other suitable substrate material. The reticle pattern designed in step 302 is exposed onto the wafer, supplied in step 303, in step 304 by a lithography system such as described above. In step 305 the semiconductor device is assembled (including a dicing process, a bonding process, and a packaging process). Finally, the device is inspected in step 306.

Figure 9:
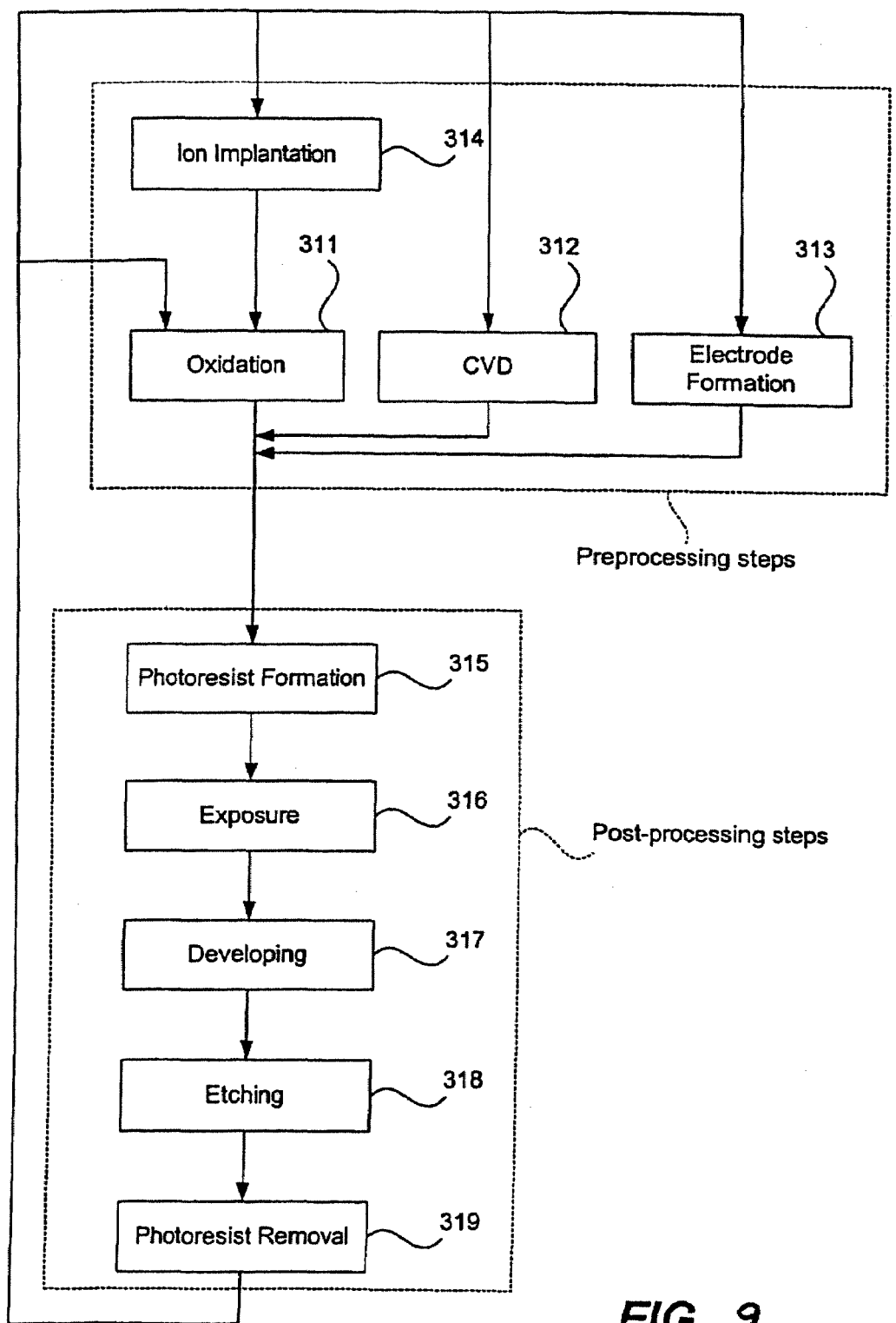
FIG. 9 is a flow-chart of the wafer-processing step shown in FIG. 8.
Figure 1:
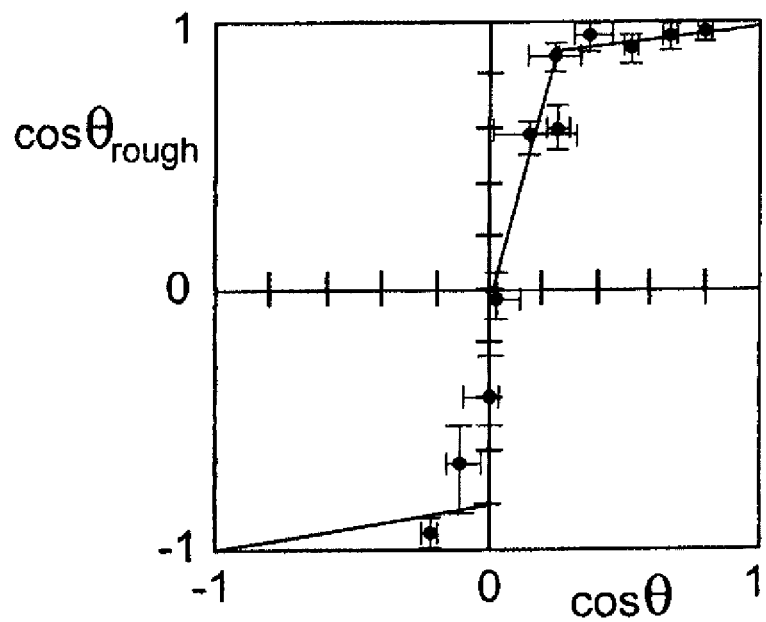
Figure 5:
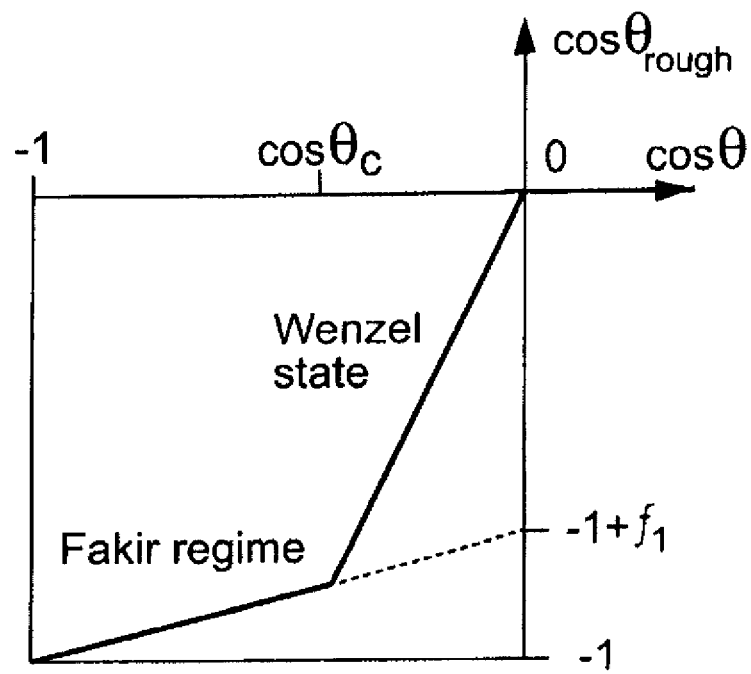
Figure 2:
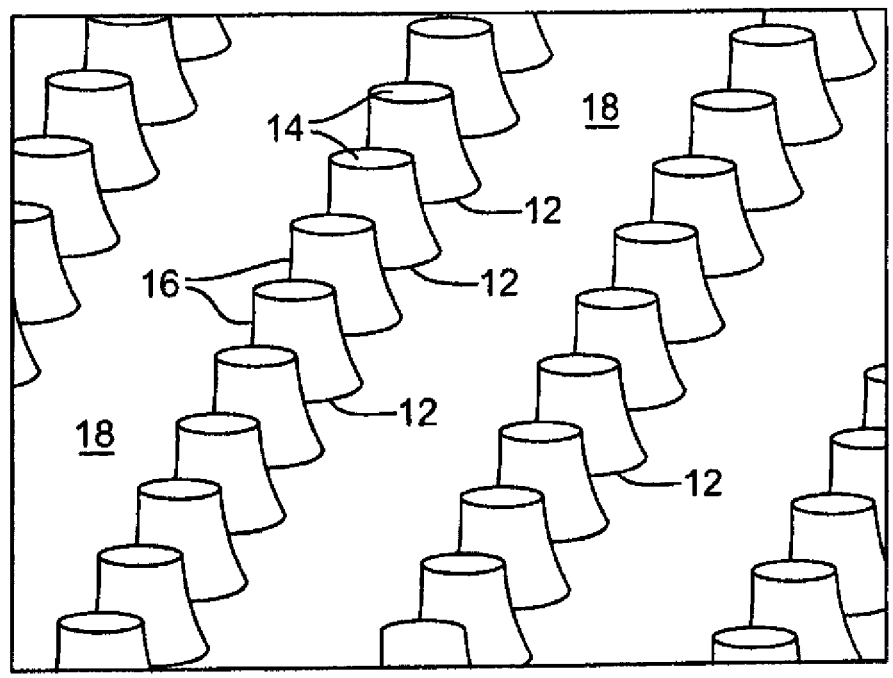
Figure 3A:
Figure 3G:
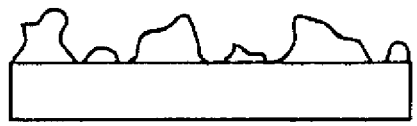
Figure 3B:
Figure 3H:
Figure 3C:
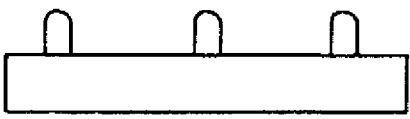
Figure 3I:
Figure 3D:
Figure 3J:
Figure 3E:
Figure 3K:
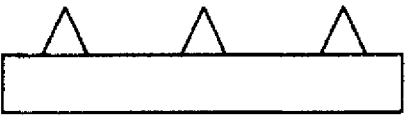
Figure 3F:
Figure 3L:
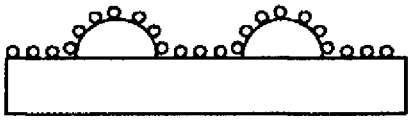

FIG. 9 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode-formation step) electrodes are formed on the wafer by vapor deposition. In step 314 (ion-implantation step), ions are implanted in the wafer. Steps 311-314 form the "pre-processing" steps for wafers during wafer processing, and selection is made at each step according to processing requirements.

At each stage of wafer processing, when the above-mentioned pre-processing steps have been completed, the following post-processing steps are implemented. During post-processing, initially, in step 315 (photoresist-formation step), photoresist is applied to the wafer. Next, in step 316 (exposure step), the above-mentioned lithography system is used to transfer the circuit pattern, defined on the reticle, onto the wafer. Then, in step 317 (developing step), the exposed wafer is developed. In step 318 (etching step), parts other than residual photoresist (exposed material surface) are removed by etching. In step 319 (photoresist-removal step), unnecessary photoresist remaining after etching is removed. Multiple circuit patterns are formed by repetition of these pre-processing and post-processing steps.

Whereas the invention has been described in connection with representative embodiments, the invention is not limited to those embodiments. On the contrary, the invention is intended to encompass all modifications, alternatives, and equivalents as may be within the spirit and scope of the invention, as defined by the appended claims.

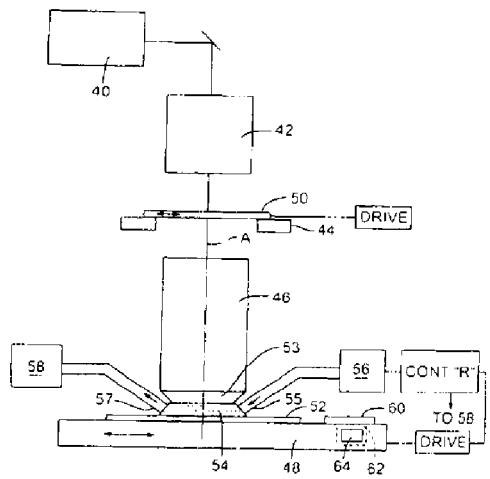

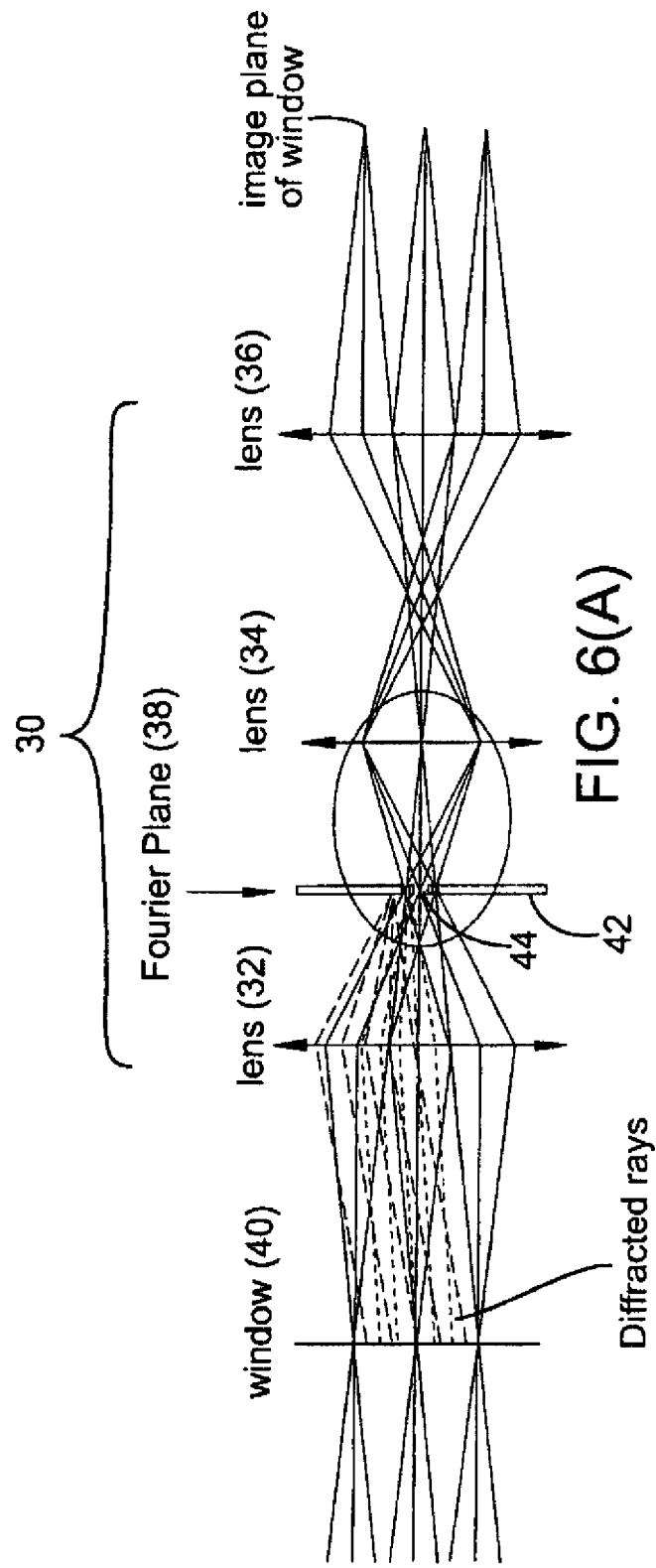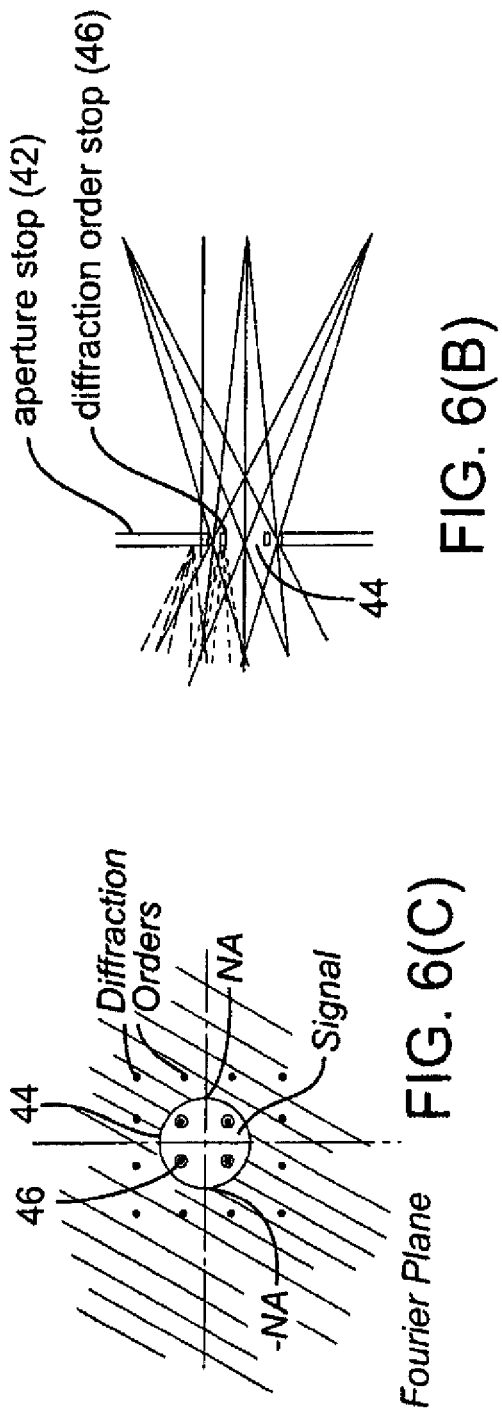

What is claimed is:

1. An immersion microlithography system utilizing an exposure light for exposing a pattern onto a substrate, the system comprising:
   a substrate stage configured to hold the substrate as the pattern is being exposed by the exposure light onto the substrate;
   a projection-optical system situated relative to the substrate stage and a source of exposure light so as to direct the exposure light onto the substrate, the exposure light from the projection-optical system passing through an exposure-light-transmissive immersion liquid situated between the projection-optical system and the substrate; and
   an optical sensor associated with the substrate stage, the optical sensor comprising (a) a light sensor; and (b) an optical window through which a beam of sensor light is transmitted to the light sensor, the optical window comprising a window substrate that is transmissive to at least one wavelength of the sensor light, the window substrate having an incidence surface that is decorated with sub-wavelength asperities arranged so as to render the incidence surface solvophobic to the immersion liquid.

2. The system of claim 1, wherein the exposure light and the sensor light are respective DUV lights.

3. The system of claim 1, wherein the sub-wavelength asperities on the optical window are selected from the group consisting of posts, peaks, pyramids, rods, nubbins, tubules, hairs, other geometric shapes, irregular shapes, and combinations thereof.

4. The system of claim 1, wherein at least some of the asperities on the optical window comprise interconnecting ridges.

5. The system of claim 1, wherein the asperities on the optical window are arranged in a regular array.

6. The system of claim 1, wherein the asperities on the optical window are arranged in an irregular array.

7. The system of claim 1, wherein the asperities on the optical window are arranged in a random array.

8. The system of claim 1, wherein the asperities on the optical window are identical to each other.

9. The system of claim 1, wherein, on the optical window:
   the asperities have respective top surfaces that are substantially not transmissive to the at least one wavelength;
   the asperities are separated from one another by hollows; and
   the hollows are transmissive to the at least one wavelength.

10. The system of claim 1, wherein each asperity on the optical window has a top surface having a dimension no greater than $\lambda/10$, wherein $\lambda$ is a wavelength of the DUV light.

11. The system of claim 1, wherein the incidence surface is a surface of a solvophobic material on at least a portion of a substrate.

12. The system of claim 11, wherein the substrate comprises a first material different from the solvophobic material.

13. The system of claim 12, wherein the first material is less solvophobic than the solvophobic material.

14. The system of claim 1, wherein:
   the asperities have respective surfaces; and
   the surfaces of the asperities comprise at least one layer of the solvophobic material.

15. The system of claim 14, wherein:
   the asperities include intervening hollows having respective surfaces; and
   the surfaces of the hollows comprise at least one layer of the solvophobic material.

16. The system of claim 1, wherein:
   the asperities include intervening hollows having respective surfaces; and
   the surfaces of the hollows comprise at least one layer of the second material.

17. The system of claim 1, wherein the optical system comprises:
   a first lens having a Fourier plane; and
   an aperture stop situated at the Fourier plane, the aperture stop defining an aperture that is sized to transmit a lower order of diffracted light from the optical window while blocking a higher order of diffracted light from the optical window.

18. The system of claim 17, where the optical sensor further comprising at least a second lens situated between the Fourier plane and the light sensor.

19. The system of claim 18, wherein the aperture stop of the optical sensor further includes at least one diffraction-order stop within the aperture.

* * * * *

UNITED STATES PATENT AND TRADEMARK OFFICE
CERTIFICATE OF CORRECTION

| | |
|---|---|
| PATENT NO. | : 7,709,813 B2 |
| APPLICATION NO. | : 11/692674 |
| DATED | : May 4, 2010 |
| INVENTOR(S) | : Sogard et al. |

It is certified that error appears in the above-identified patent and that said Letters Patent is hereby corrected as shown below:

The Title Page, showing an illustrative figure should be deleted and substitute therefor the attached Title Page.

In the Drawings:

The attached formal drawings (FIGS. 1-9) should replace informal FIGS. 1-9, respectively.

In the Specification:

Column 6, line 66, "100° to 10°" should be --100° to 110°--.

Column 7, line 6, "1500" should be --150°--.

In the Claims:

Column 16, line 44, "where the optical sensor further comprising" should be --where the optical sensor further comprises--.

Signed and Sealed this
Fifteenth Day of May, 2012

David J. Kappos
*Director of the United States Patent and Trademark Office*

(12) United States Patent
Sogard

(10) Patent No.: US 7,709,813 B2
(45) Date of Patent: May 4, 2010

(54) INCIDENCE SURFACES AND OPTICAL WINDOWS THAT ARE SOLVOPHOBIC TO IMMERSION LIQUIDS

(75) Inventor: Michael R. Sogard, Menlo Park, CA (US)

(73) Assignee: Nikon Corporation, Tokyo (JP)

(*) Notice: Subject to any disclaimer, the term of this patent is extended or adjusted under 35 U.S.C. 154(b) by 63 days.

(21) Appl. No.: 11/692,674

(22) Filed: Mar. 28, 2007

(65) Prior Publication Data
US 2007/0229957 A1 Oct. 4, 2007

Related U.S. Application Data

(60) Provisional application No. 60/789,025, filed on Apr. 3, 2006.

(51) Int. Cl.
G02B 1/10 (2006.01)
(52) U.S. Cl. .................................. 250/492.1
(58) Field of Classification Search ............... 250/372
See application file for complete search history.

(56) References Cited

U.S. PATENT DOCUMENTS

| | | | |
|---|---|---|---|
| 7,075,616 B2 * | 7/2006 | Derksen et al. | 355/30 |
| 2004/0211920 A1 * | 10/2004 | Maria Derksen et al. | 250/492.1 |
| 2005/0123863 A1 * | 6/2005 | Chang et al. | 430/322 |
| 2005/0134815 A1 * | 6/2005 | Van Santen et al. | 355/30 |
| 2005/0147920 A1 * | 7/2005 | Lin et al. | 430/311 |
| 2005/0161644 A1 * | 7/2005 | Zhang et al. | 252/582 |
| 2005/0175776 A1 | 8/2005 | Streefkerk et al. | |
| 2005/0175940 A1 * | 8/2005 | Dierichs | 430/322 |
| 2005/0181195 A1 * | 8/2005 | Dubrow | 428/297.4 |
| 2005/0202351 A1 * | 9/2005 | Houlihan et al. | 430/322 |
| 2005/0259234 A1 * | 11/2005 | Hirukawa et al. | 355/53 |
| 2005/0264774 A1 * | 12/2005 | Mizutani et al. | 355/30 |
| 2006/0017900 A1 | 1/2006 | Novak | |
| 2006/0023182 A1 | 2/2006 | Novak et al. | |
| 2006/0023183 A1 | 2/2006 | Novak et al. | |
| 2006/0023184 A1 | 2/2006 | Coon et al. | |
| 2006/0023185 A1 | 2/2006 | Hazelton et al. | |
| 2006/0023186 A1 | 2/2006 | Binnard | |
| 2006/0023187 A1 | 2/2006 | Eaton | |

(Continued)

FOREIGN PATENT DOCUMENTS

EP 1 699 072 A1 9/2006

(Continued)

OTHER PUBLICATIONS

"Technology backgrounder: Immersion Lithography," ICKnowledge, pp. 1-5, 2003.

(Continued)

Primary Examiner—David P Porta
Assistant Examiner—Djura Malevic
(74) Attorney, Agent, or Firm—Klarquist Sparkman, LLP

(57) ABSTRACT

Optical windows are provided that transmit light such as deep-UV (DUV) light. An exemplary window includes a window substrate that is transmissive to at least one wavelength of the light. The window substrate has an incidence surface decorated with sub-wavelength asperities arranged so as to render the incidence surface solvophobic to the light-transmissive liquid. The arrangement of sub-wavelength asperities can be configured to render the incidence surface super-solvophobic to the liquid. The sub-wavelength asperities can have any of various shapes and combinations thereof, and can be regularly or irregularly arranged.

19 Claims, 8 Drawing Sheets